(12) United States Patent
Wunderer et al.

(10) Patent No.: US 9,640,732 B2
(45) Date of Patent: May 2, 2017

(54) SMALL-SIZED LIGHT-EMITTING DIODE CHIPLETS AND METHOD OF FABRICATION THEREOF

(71) Applicant: PALO ALTO RESEARCH CENTER INCORPORATED, Palo Alto, CA (US)

(72) Inventors: Thomas Wunderer, Palo Alto, CA (US); Christopher L. Chua, San Jose, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/003,251

(22) Filed: Jan. 21, 2016

(65) Prior Publication Data
US 2016/0149087 A1 May 26, 2016

Related U.S. Application Data

(62) Division of application No. 14/137,919, filed on Dec. 20, 2013.

(51) Int. Cl.
*H01L 33/48* (2010.01)
*H01L 33/32* (2010.01)
(Continued)

(52) U.S. Cl.
CPC .............. *H01L 33/48* (2013.01); *H01L 27/15* (2013.01); *H01L 33/0025* (2013.01);
(Continued)

(58) Field of Classification Search
CPC .................................. H01L 33/32; H01L 33/48
See application file for complete search history.

(56) References Cited

U.S. PATENT DOCUMENTS

| 8,241,932 B1* | 8/2012 | Yu ........................ H01L 25/0753 257/E21.122 |
| 2010/0032701 A1* | 2/2010 | Fudeta .................... H01L 33/46 257/98 |

(Continued)

OTHER PUBLICATIONS

Rogers et al., "High-efficiency, microscale GaN light-emitting diodes and their thermal properties on unusual substrates," small 2012, vol. 8, No. 11, pp. 1643-1649.*

(Continued)

*Primary Examiner* — Lex Malsawma
*Assistant Examiner* — Xia Cross
(74) *Attorney, Agent, or Firm* — Blakely Sokoloff Taylor & Zafmann LLP

(57) ABSTRACT

Diode includes light emitting region, first metal layer, dielectric layer, and second metal layer. Light emitting diode includes n-type group III-nitride portion, p-type group III-nitride layer, and light emitting region sandwiched between n- and p-type layers. First metal layer may be coupled to p-type III-N portion and plurality of first terminals. First metal layer and p-type III-N portion may have substantially similar lateral size that is smaller than 200 micrometers. A portion of light emitting region and first metal layer may include a single via. Electrically-insulating layer may be coupled to first metal layer and sides of the single via. First terminals may be exposed from electrically-insulating layer. Second metal layer may include second terminal and may be coupled to electrically-insulating layer and to n-type III-N portion through the single via. The thickness of the diode excluding second terminal may be between 2 and 20 micrometers. Other embodiments are described.

10 Claims, 12 Drawing Sheets

(51) Int. Cl.
*H01L 33/20* (2010.01)
*H01L 33/38* (2010.01)
*H01L 27/15* (2006.01)
*H01L 33/00* (2010.01)
*H01L 33/14* (2010.01)

(52) U.S. Cl.
CPC ............ *H01L 33/145* (2013.01); *H01L 33/20* (2013.01); *H01L 33/32* (2013.01); *H01L 33/382* (2013.01); *H01L 33/385* (2013.01); *H01L 2933/0016* (2013.01)

(56) References Cited

U.S. PATENT DOCUMENTS

| | | | |
|---|---|---|---|
| 2011/0266579 A1* | 11/2011 | Nagai | H01L 27/156 |
| | | | 257/98 |
| 2013/0119422 A1 | 5/2013 | Nagai | |
| 2015/0179873 A1 | 6/2015 | Wunderer et al. | |

OTHER PUBLICATIONS

Rogers, "High-efficiency, microscale GaN light-emitting diodes and their thermal properties on unusual substrates," small 2012, vol. 8, No. 11, pp. 1643-1649.
Office Action dated Mar. 10, 2015 for U.S. Appl. No. 14/137,919.
Final Office Action dated Sep. 15, 2015 for U.S. Appl. No. 14/137,919.

* cited by examiner

SMALL-SIZED LIGHT-EMITTING DIODE CHIPLETS AND METHOD OF FABRICATION THEREOF

CROSS REFERENCE TO RELATED APPLICATIONS

This application is a divisional of application Ser. No. 14/137,919, filed Dec. 20, 2013, the entire contents of which is hereby incorporated by reference in its entirety.

FIELD

Embodiments of the invention relate generally to small-sized light-emitting diode (LED) chiplets and methods of fabrication thereof.

BACKGROUND

Currently, light-emitting diodes (LED) are made of a heterostructure that includes a plurality of layers that each performs a specific function. One of the layers is called the active region which includes several quantum wells. In designing the LED, one objective is to confine the electrons and holes in the active region in order to force their recombination to emit a photon in the active region. The composition of material included in the active region determines the color of the light to be emitted from the LED. The photons being generated are then extracted out of the semiconductor. LEDs can be used for different applications such as general lighting, indicators, displays, etc.

The typical light producing area of current LEDs has dimensions between about 200×200 microns and 4 mm×4 mm. This has implications to the device performance, product design and cost. Practical imperfections of the LED lead to losses in efficiency that directly translates into heating and further reduction in performance and lifetime. Due to the fact that the heat generation occurs within a relative small volume adequate heat management components are required that make the LED package rather complicated and add additional costs to the final product. Small-sized LED chiplets that are distributed over a larger area might significantly improve this situation. Simple fabrication methods including printing of the small-sized LEDs might be combined with their deposition onto flexible substrates that enable a new class of LED products. Furthermore, small-sized LEDs might be implemented as individually addressable active optical elements in display applications.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

As discussed below, embodiments of the invention pertains to the design and fabrication methods for small-sized LED chiplets that are capable of high performance operation. According to some embodiments of the invention, the LED chiplets may be mixed into ink and printed onto flexible, large area substrates to produce LED luminaries. In these embodiments, the chiplets are first released from the carrier wafer for printing. The LED chiplets may also be used as "pick-and-place" elements to produce lighting devices for displays. The LED chiplets may be used to produce monochromatic as well as full color displays (e.g., RGB), where each LED chiplet may represent a single or a part of a single pixel to be individually addressed.

Figure 1:
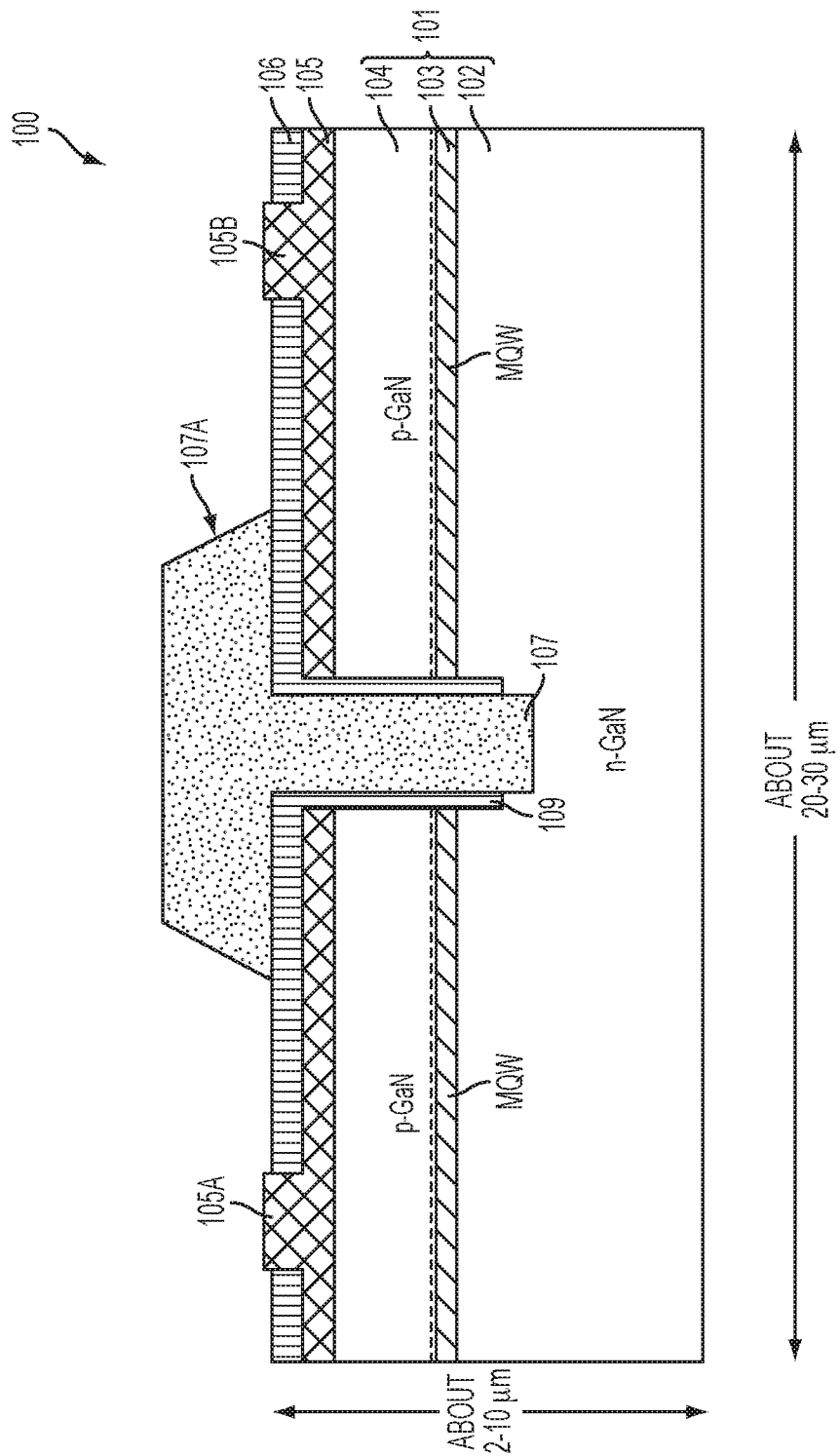
FIG. 1 illustrates a cross-sectional view illustrating an exemplary diode chiplet in accordance with a first embodiment of the invention.

FIG. 1 illustrates a cross-sectional view illustrating an exemplary diode in accordance with a first embodiment of the invention. The diode (chiplet) 100 which may be formed on a substrate (not shown). The substrate may then be removed by laser lift-off or other means of substrate removal technique. The substrate may be made of, for instance, sapphire, silicon carbine, silicon, or Gallium Nitride. In some embodiments, a sapphire substrate may be used that is 4 inches wide and relatively thick (e.g., 500 microns in thickness).

As shown in FIG. 1, a couple of microns of Gallium Nitride may be grown on the substrate and n-doped in order to obtain an n+ GaN layer 102. The dopant used to achieve the n+ GaN layer 102 may be silicon. In one embodiment, the n+ GaN layer 102 is around 2 to 10 micrometers in thickness. In another embodiment, the first few micrometers of the GaN layer 102 may be undoped, before the rest of the GaN layer 102 is n-type doped. In another embodiment, the GaN layer 102 may include layers with various n-type doping concentrations. In another embodiment, layer 102 may be comprised of a group III-nitride material that is not pure GaN, such as AlGaN, GaInN, AlGaInN or a heterostructure made out of these materials, e.g., a short-period superlattice AlGaN/GaN, with different doping levels.

An active zone or quantum well (QW) or multiple quantum well (MQW) region 103 may then be grown on the n+ GaN layer 102. For example, to obtain a blue regime, the active region 103 may include quantum wells made of Indium Gallium Nitride (e.g., 15% Indium, 85% Gallium) and Gallium Nitride may be the material used between the quantum wells. The quantum wells made of Indium Gallium Nitride may be between 1.5 and 10 nanometers in thickness. The Gallium Nitride barrier between each of the quantum wells may be about 4 to 20 nanometers in thickness. In one embodiment, the MQW region 103 is around 50 to 100 nanometers in thickness.

In the fabrication of the LED, one objective is to confine the electrons and holes in the active region 103 and force recombination in order to emit a photon in the active region 103. An electron blocking layer (illustrated as dashed line in FIG. 1) may then be grown on top of the active region 103. The electron blocking layer may be made of Aluminum Gallium Nitride (e.g., 20% Aluminum, 80% Gallium). In one embodiment, the electron blocking layer is around 20 nanometers in thickness. In another embodiment, the composition of the Aluminum Gallium Nitride may contain between 10-30% Aluminum and be between 10 and 50 nanometers in thickness. The electron blocking layer may already be p-type doped and the dopant may be magnesium. The electron blocking layer functions as a layer that blocks the electrons from the n-side from entering the p-side. The electron blocking layer may aid in the confinement of the electrons in the active layer 103.

The p+ GaN layer 104 may then be grown on top of the electron blocking layer. In one embodiment, the p+ GaN layer 104 is around 100-200 nanometers in thickness. In another embodiment, the p+ GaN layer 104 is up to 500 nanometers in thickness. The optimal thickness of the p+ GaN layer 104 is dependent on the wavelength of the emission.

As shown in FIG. 1, the diode chiplet 100 comprises a complex group III-nitride-based heterostructure including at least: n+ group III-nitride layer 102, light emitting region 103, and p+ group III-nitride layer 104. Additional layers may be included that increase the performance of the device such as strain management or defect reduction layers or layers that improve the electrical performance of the device, etc.

The diode chiplet 100 further includes a first metal layer 105 that is deposited on the p+ GaN layer 104. The first metal layer 105 forms the p-contact. In one embodiment, the first metal layer 105 is annealed after deposition to form a good ohmic contact with low contact resistance. Annealing the first metal layer 105 may include heating the first metal layer 105 to a temperature of about 530° C. for 5 min in N2. In the fabrication of high power light-emitting diodes (LED), the p-contact has to perform two functions: (1) an electrical function and (2) an optical function. The electrical function of the p-contact is to provide good ohmic contact such that current is able to pass through the contact and the losses in efficiency of the device are minimized. Accordingly, the resistance of the p-contact has to be low. The optical function of the p-contact is to either reflect the light generated within the active zone in a bottom emitting device architecture or to transmit the light for a top emitter. Accordingly, materials such as Silver (Ag), Aluminum (Al), and Platinum (Pt) may be used as the first metal layer 105. In one embodiment, the first metal layer 105 includes Silver (Ag) which provides good ohmic contact and acts as a reflector. The first metal layer 105 that includes Silver (Ag) may be between 100 and 500 nanometers in thickness. In another embodiment, in order to provide good ohmic contact, the first metal layer 105 may further include a thin layer of Nickel (Ni) (e.g., 0.5-3 nanometers) that is deposited and oxidized to form Nickel Oxide (NiO). The Silver (Ag), Aluminum (Al), or Platinum (Pt) (e.g., 100-500 nanometers in thickness) may then be deposited on the thin layer of Nickel Oxide. Given the thinness of the Nickel Oxide (NiO) layer as well as its transparency, the Nickel oxide layer (NiO) does not impede on the optical function of the p-contact while providing good ohmic contact with the p+ GaN layer. In this embodiment, the Silver (Ag) layer is deposited on the Nickel Oxide (NiO) layer. Other examples of materials that may be used includes a Silver (Ag) layer that is deposited on top of a thin layer of Gold (Au) rather than on the Nickel Oxide (NiO) layer. In other examples, materials that may be used as the first metal layer 105 include: Indium Tin Oxide (ITO) and a Silver (Ag) layer that may be deposited on the ITO. The ITO provides good ohmic contact and is also transparent such that it does not impede on the optical function of the p-contact. The ITO portion of the first metal layer 105 may be relatively thick: 50 to 500 nanometers. The first metal layer 105 may also include distributed Bragg reflectors (DBRs) that are placed on top of the ITO portion. The DBRs may include two layered components: For example, Silicon dioxide and Titanium dioxide. Each layer may be ¼ of the optical thickness. In one embodiment, the DBRs include a plurality of layers that alternate between the Silicon dioxide layer and the Titanium dioxide layer (e.g., 10 layers of each). The DBRs are very reflective but are not conductive. However, the ITO portion under the DBRs is very conductive. In one embodiment, the diode chiplet 100 may be a top emitter such that the first metal layer 105 is transparent. In this embodiment, the first metal layer 105 includes the thin layer of Nickel (Ni) (e.g., 0.5-3 nanometers) that is deposited and oxidized to form Nickel Oxide (NiO). In some embodiment, and the first metal layer 105 includes a thin (e.g., 2-10 nanometers) of Nickel Gold (NiAu) layer that is deposited and oxidized. In some embodiments, the first metal layer 105 may include Indium Tin Oxide (ITO). In some embodiments, the first metal layer 105 includes Nickel (Ni), Platinum (Pt), or Palladium (Pd).

As shown in FIG. 1, the first metal layer 105 may have a lateral size that is substantially equal to the lateral size of the light emitting device 100. Accordingly, the p-contact formed by the first metal layer 105 has a large area and is highly reflective such that the optical function of the p-contact is achieved. More specifically, a large reflective p-contact area is beneficial to reflect and redirect photons that are emitted towards the p-side for light extraction through the bottom of the diode chiplet 100.

Having a large area p-contact also reduces the contact resistance that is dependent on the geometry. Furthermore, the large p-contact also keeps the current density low and, with output power being proportional to the current density in a not ideal group III-nitride device (also known as droop phenomenon), the efficiency of the device is improved. Further, since the p-GaN layer 104 is much less conductive (e.g., about 100 times less conductive) than the n-GaN layer 102, the p-GaN layer 104 may also be thin (e.g., 100 nanometers to 200 nanometers in thickness) in some embodiments. The combination of the large area p-contact (e.g., first metal layer 105) and the thin p-GaN layer 104 allows for the current from the p-contact to only have to travel through a thin p-GaN layer 104. In other words, the design of the p-contact further decreases the effective contact resistance and the current density, with which the droop in nitride emitters can be reduced.

In one embodiment, the size and shape of the chiplet structure may be defined at this stage. For instance, a photoresist may be deposited and developed into the desired shape and size of the chiplet structure. Regarding the desired size and shape, FIGS. 2A-2F illustrate the top views of exemplary diode chiplet s 100 of FIG. 1.

Referring back to FIG. 1, the first metal layer 105 and a portion of the diode chiplet 100 may be etched to include a via 109. The via 109 may be etched in a central portion of the diode chiplet 100 and may extend through the first metal layer 105 and through the p+ GaN layer 104, the quantum well region 103, and a part of the n+ GaN layer 102. In some embodiments, this portion of the diode chiplet 100 below the first metal layer 105 that is etched (e.g., p+ GaN layer 104, the quantum well region 103, and a part of the n+ GaN layer 102) defines a mesa. The via 109 may be sized to be small enough not to greatly reduce the light generation area of the diode chiplet 100 but large enough to handle sufficient current. Accordingly, in some embodiments, the via 109 is between 500 nanometers to under 10 micrometers in lateral size.

A dielectric layer 106 may then be deposited on the first metal layer 105 and partly into the via 109. In one embodiment, the partly coverage of the via side walls may be achieved by slightly tilting and rotating the wafer during the deposition of the dielectric layer 106. In one embodiment, the dielectric layer 106 includes silicon nitride (SiN). In another embodiment, the dielectric layer 106 includes silicon dioxide ($SiO_2$). The dielectric layer 106 may be relatively thin but thick enough to be electrically isolating (or electrically-insulating). For instance, the dielectric layer 106 may be between 20 and 30 nanometers in thickness. In other embodiments, the dielectric layer 106 may be up to 200 nanometers in thickness. In another embodiment, the dielectric layer 106 may be an electrically-insulating layer that includes deposited interlayers such as, for example, vanadium oxide, Si, and Atomic Layer Deposition (ALD)-deposited films. In another embodiment, the dielectric layer 106 may be an electrically-insulating layer that includes organic films such as polymers.

A second metal layer 107 that is formed to include a second terminal 107A in FIG. 1 may be deposited on the dielectric layer 106 and into the center of the via 109. Similar to the first metal layer 105, in one embodiment, the second metal layer 107 is annealed after deposition to form a good ohmic contact with low contact resistance. Annealing the second metal layer 107 may include heating the first metal layer 105 to a temperature of about 530° C. for 5 min in N2. Accordingly, the second terminal 107A and the second metal layer 107 are coupled to the n+ GaN layer 102 through the via 109. Specifically, as shown in FIG. 1, the second terminal 107A and the second metal layer 107 may be in ohmic contact with the n+ GaN layer 102 and separated by the dielectric layer 106 from the first metal layer 105, the p+ GaN layer 104 and the quantum well region 102. The second terminal 107A may be a metal bump for printing purposes and an n-contact. The second metal layer 107 and the second terminal 107A may be a layered stack of metals including a bottom layer of Titanium (Ti) (e.g., 40 nanometers in thickness), followed by a layer of Aluminum (Al) (e.g., 220 nanometers in thickness), followed by another layer of Titanium (Ti) (e.g., 40 nanometers in thickness), and a top layer of Gold (Au) (e.g., 50-100 nanometers in thickness). In some embodiments, Nickel may be used in lieu of the layer of Titanium coupled to the top layer of Gold. Each layer of the second terminal 107A may perform a function. For instance, the bottom layer of Titanium may be for adhesion, the Aluminum layer may be to provide the electrical property (or ohmic contact), and the second layer of Titanium is provided as a protective layer to avoid the diffusion of the Gold into the Aluminum. Gold is known as inert material that does not oxidize other than for example Aluminum and is therefore used as final metal layer.

In this embodiment, the second metal layer 107 (e.g., n-metal) is designed to not significantly interfere with the light extraction properties, but still allow a homogeneous carrier injection. Specifically, the via 109 is small and provides access to the n+ GaN layer 102 from the top of the diode chiplet 100 such that the interference with the light extraction properties is minimized.

As shown in FIG. 1, one or more portions of the dielectric layer 106 may be etched to reach the top of the first metal layer 105. In FIG. 1, the portion being etched away is a rectangular shape. However, it is understood that the portion that is being etched away may be any suitable shape. A metal layer or film may be deposited into one or more portions of the dielectric layer 106 that have been etched away. This metal layer may be the same material as the first metal layer 105 and form the first terminals 105A, 105B that are in ohmic contact with the p+ GaN layer 104. Accordingly, the first terminals 105A, 105B may form the reflective p-contacts for the device 100.

As shown in FIG. 1, in one embodiment, the diode chiplet 100 has a lateral size between about 20 and 30 microns and the diode chiplet 100 excluding the second terminal 107A has a thickness between 2.5 to 10 microns. In one embodiment, the second terminal 107A may be about ⅓ of the thickness of remaining portions of the diode chiplet 100. In one embodiment, the lateral size of the diode chiplet 100 may be as small as 100 nanometers and as large as 200 micrometers. In one embodiment, the perimeter of the diode chiplet 100 is smaller than 600 micrometers.

In this embodiment, the current spreads from the second metal layer 107 in the center of the diode (or chiplet) 100 towards the edges of the diode chiplet 100 which may be around 15 micrometers (e.g., radius of the diode chiplet 100) in order to homogeneously pump the quantum wells in the MQW region 103. Thus, the distance traveled by the current from the second metal layer 107 in the center of the diode chiplet 100 may be about 100 times the distance travelled by current from the p-contacts 105A, 105B to the MQW region 103. However, the efficiency of the diode chiplet 100 may not be affected since the n-GaN layer 102 is more conductive (e.g., 100 times more) than the p-GaN layer 104. In this embodiment, with the second metal layer 107 (i.e., n-metal) being deposited on the mesa structure, the current flows from the n-metal to the MQW region 103 and the holes travel from the first metal layer 105 (i.e., p-contact) through the p-GaN layer 104 to the MQW region 103 to allow for the recombination to occur in the MQW region 103.

In this embodiment of the invention, the single via 109 is sufficient to achieve homogeneous carrier injections because of the small size of the diode chiplet 100. In one embodiment, the diode chiplet 100 is about 200 microns by 200 microns in size. To allow for efficient current spreading capability within the n-type layer 102 elements may be included to further enhance the lateral conductivity. This may include layers with differently high doping concentration or AlGaN/GaN short period superlattice structures. Homogeneous carrier injection into the active zone (e.g., MQW region 103) enables homogeneous photon generation and high efficiency.

Figure 2A:
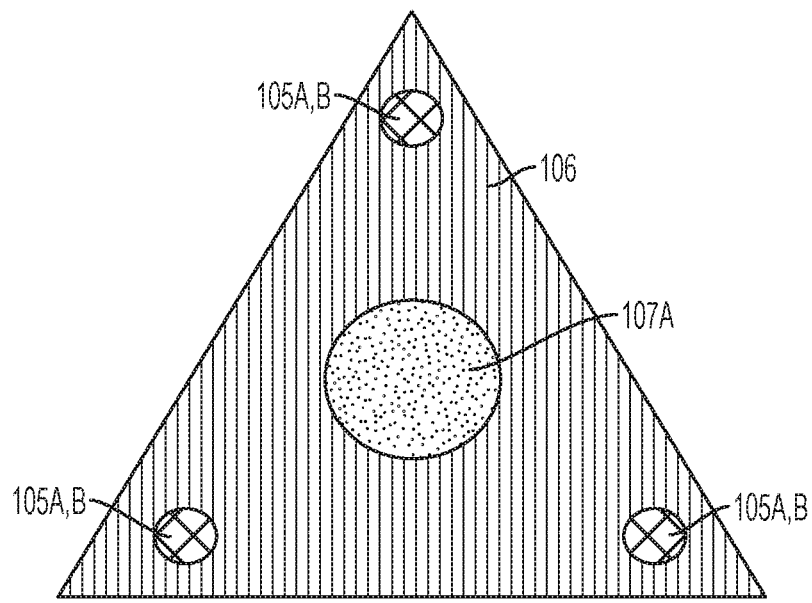
FIGS. 2A-2F illustrate top views of the exemplary diode chiplet in FIG. 1 according to embodiments of the invention.
Figure 2B:
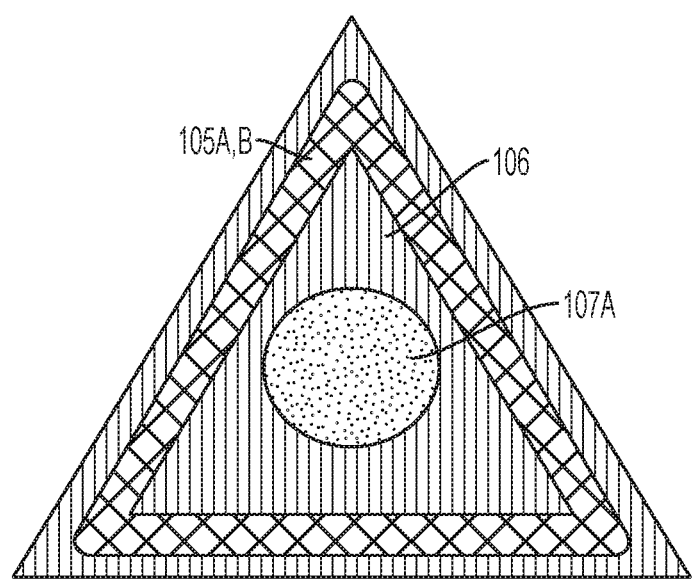
Figure 2C:
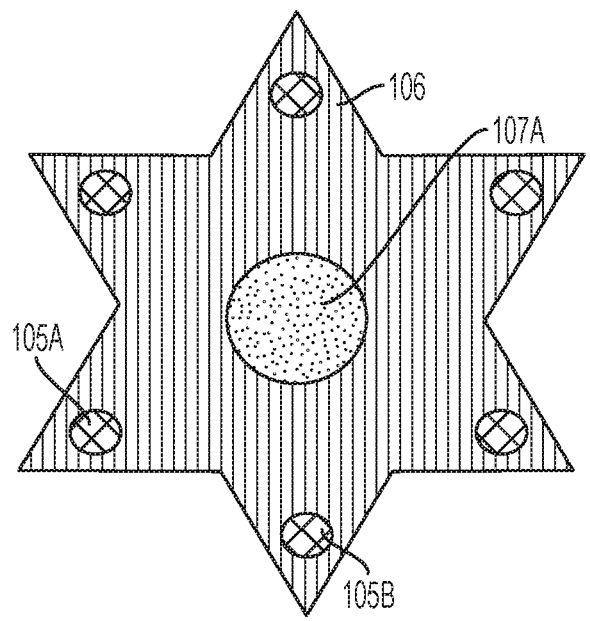
Figure 2D:
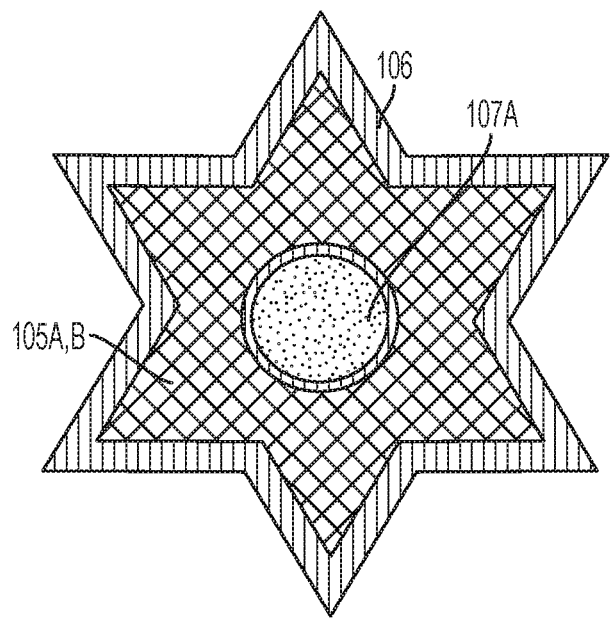
Figure 2E:
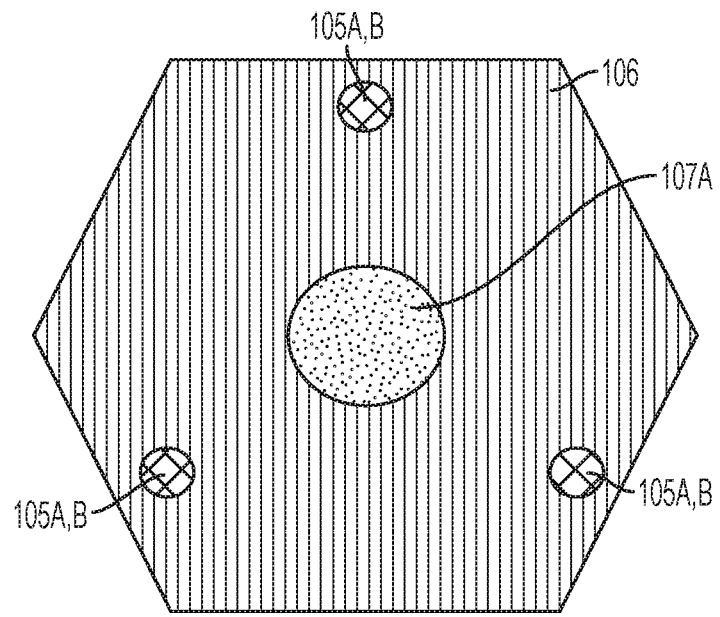
Figure 2F:
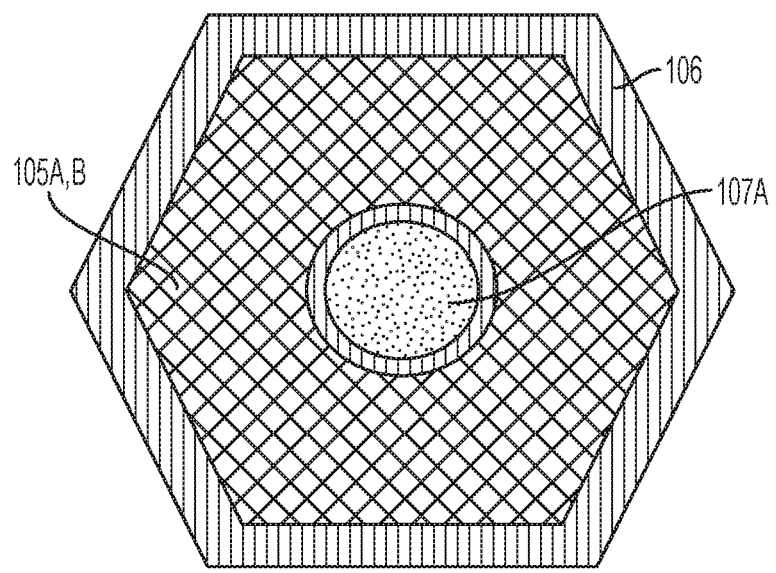

The group III Nitride material system has a relatively high refractive index. If the photon in the semiconductor hits a surface that is not prepared or altered, only a fraction of the photons (e.g., 20%) are able to escape. Instead, most of the light is experiencing total internal reflection and it cannot escape the semiconductor. To ensure that all the photons that are generated are extracted out of the semiconductor, in one embodiment, the backside of n-GaN region 102 is roughened in order to scatter several times the light that hits the surface. This allows the scattered light to eventually escape from the semiconductor. Accordingly, the photons that are first emitted towards the p-side are now redirected by a reflector (e.g., towards the roughened side of the n-GaN region 102), which redirects the photons to the n-side. Further, the photons travelling sideways in the diode chiplet 100 towards the edges of the LED chip are reflected or redirected at a different angle due the shape of the diode chiplet 100 and to reach the side walls or the roughened backside of the n-GaN region 102 to be extracted. As shown in FIGS. 2A-2F, various shape of the diode chiplet 100 may be effective to extract all the photons out of the diode chiplet 100. FIGS. 2A-2F illustrate top views of the exemplary diode in FIG. 1 according to embodiments of the invention. FIGS. 2A-2B illustrate the n-GaN region 102, the MQW region 103, p-GaN layer 104, the first metal layer 105 and the dielectric layer 106 of diode chiplet 100 being substantially triangular in shape in the x-y plane. Further, the p-contacts are formed as points in the embodiment in FIG. 2A and are formed as a continuous metal film in FIG. 2B. FIGS. 2C-2D illustrate the n-GaN region 102, the MQW region 103, p-GaN layer 104, the first metal layer 105 and the dielectric layer 106 of diode chiplet 100 being substantially stellate in shape (or star-shape) in the x-y plane. FIGS. 2E-2F illustrate the n-GaN region 102, the MQW region 103, p-GaN layer 104, the first metal layer 105 and the dielectric layer 106 of diode chiplet 100 being substantially hexagonal in shape in the x-y plane. In other embodiments, the n-GaN region 102, the MQW region 103, p-GaN layer 104, the first metal layer 105 and the dielectric layer 106 of diode chiplet 100 may also be substantially circular in shape in the x-y plane or substantially quadratic in shape in the x-y plane. Using the various shapes illustrated in FIGS. 2A-2F, a high light extraction capability and a high packing density during processing may be achieved. Further, the various shapes may also enable printability if needed. While the top views of the embodiments illustrated in FIGS. 2A-2F are straight-edged triangular, stellate, and hexagonal diode chiplets 100, respectively, it is understood that the edges of the n+ GaN layer 102, quantum well region 103, p+ GaN layer 104 and an electron blocking layer, the first metal layer 105 and the dielectric layer 106 of diode chiplet 100 may be rounded. The rounded edges may further avoid clogging or sticking during the printing process.

Figure 3A:
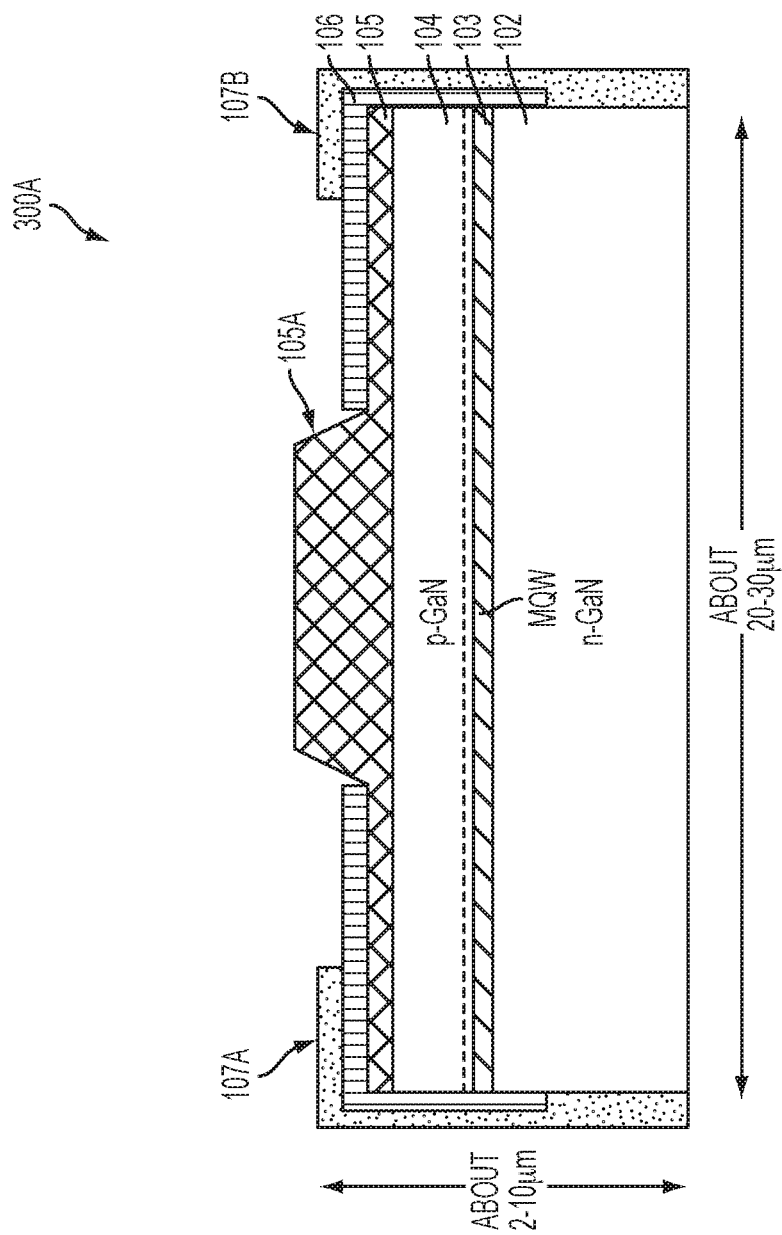
FIGS. 3A-3B illustrate cross-sectional views illustrating exemplary diode chiplets in accordance with a second and a third embodiment of the invention, respectively.
Figure 3B:
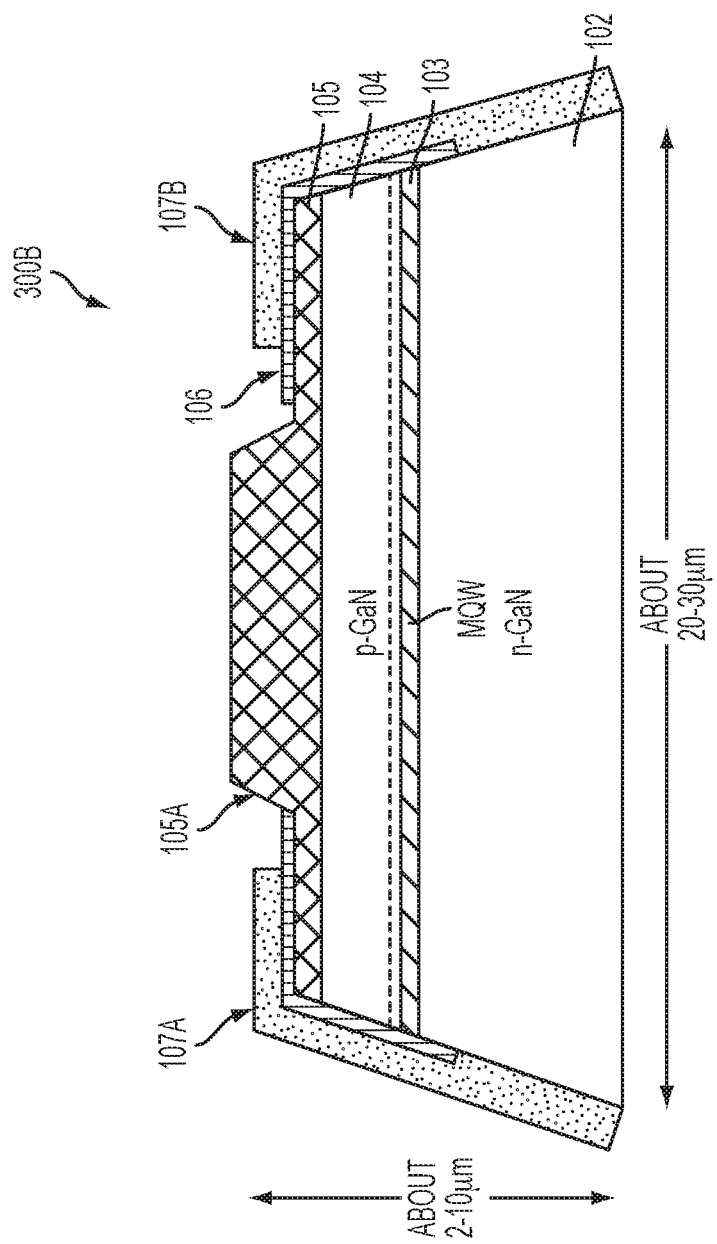

FIGS. 3A-3B illustrate cross-sectional views illustrating exemplary diodes in accordance with a second and a third embodiment of the invention, respectively. Similar to the diode chiplet 100 in FIG. 1, the diode chiplets 300A (FIG. 3A) and 300B (FIG. 3B) includes n+ GaN layer 102, quantum well region 103, p+ GaN layer 104 and an electron blocking layer (dashed lines). The first metal layer 105 in diode chiplets 300A and 300B has a bottom side that is coupled to the p+ GaN layer 104. The first metal layer 105 may be annealed. As shown in FIGS. 3A-3B, the bottom side of the first metal layer 105 in diode chiplets 300A and 300B has a lateral size that is substantially equal to the lateral size of the p+ GaN layer 104. Accordingly, the first metal layer 105 may cover the entire surface of the p+ GaN layer 104 as shown in FIGS. 3A and 3B and thus, form a large p-contact. The first metal layer 105 may be in ohmic contact with the p+ GaN layer 104.

Figure 4A:
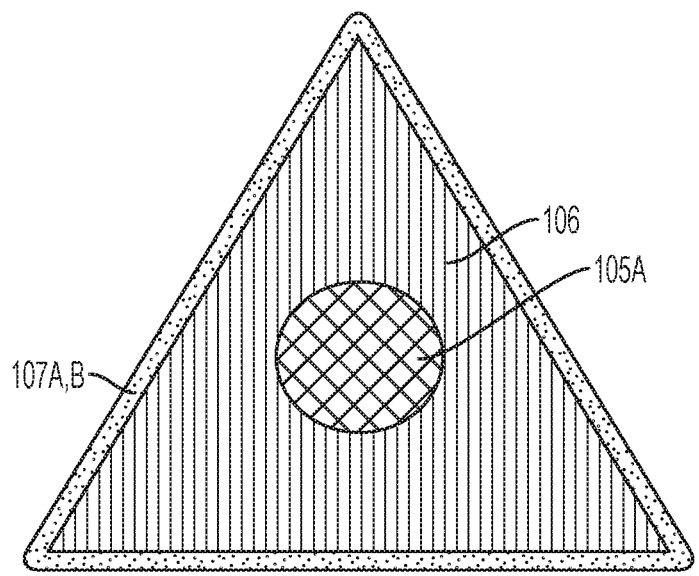
FIGS. 4A-4C illustrate top views of the exemplary diode chiplets in FIGS. 3A-3B according to embodiments of the invention.
Figure 4B:
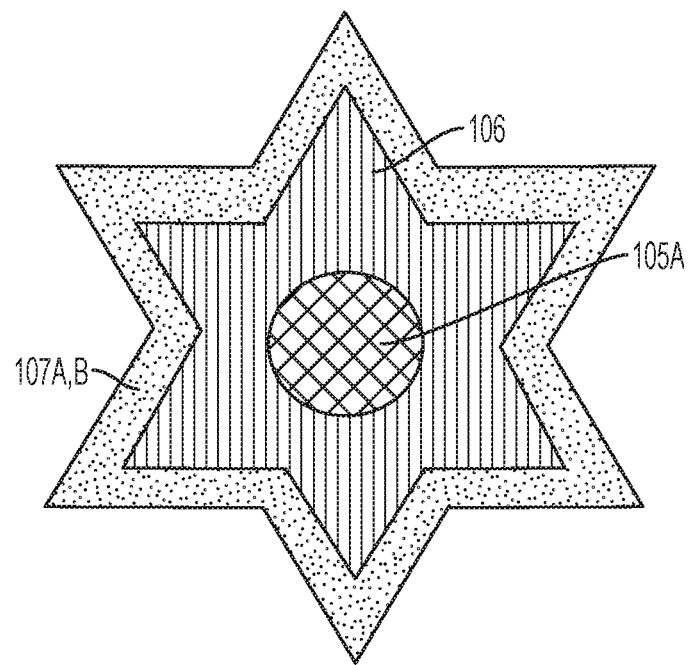
Figure 4C:
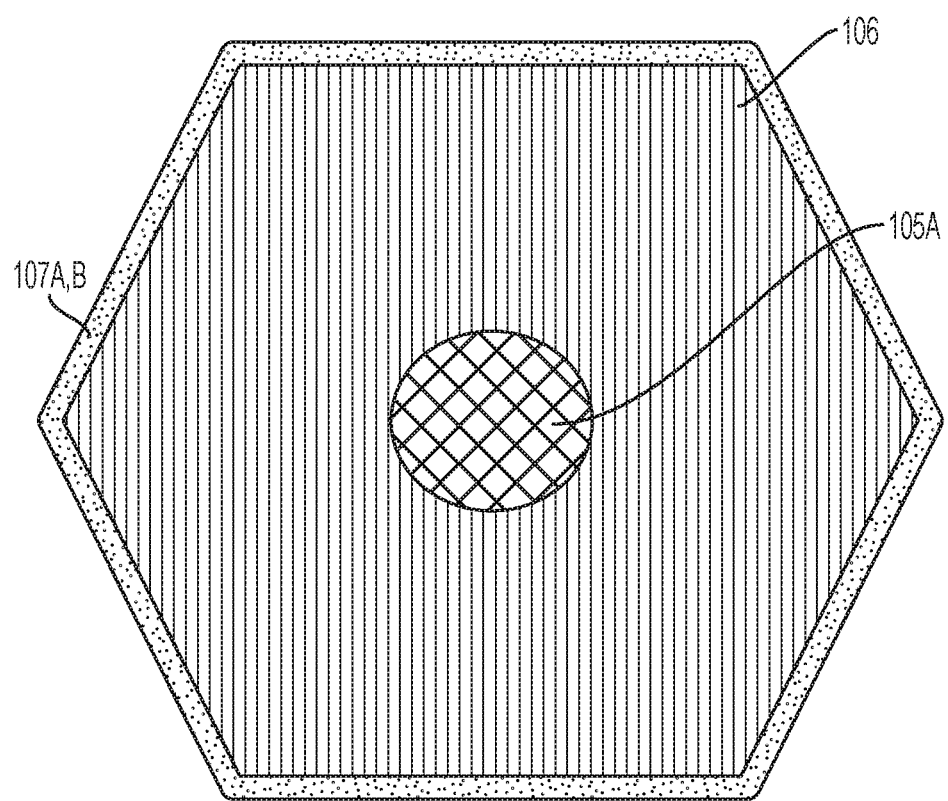

The size and shape of the diode chiplet 300A, 300B may then be defined at this stage. For instance, a photoresist may be deposited and developed into the desired shape and size of the chiplet structure. Regarding the desired size and shape, FIGS. 4A-4C illustrate the top views of exemplary diode chiplets of FIGS. 3A-3B.

As shown in FIGS. 3A-3B, the dielectric layer 106 is deposited on the top side of the first metal layer 105 and a portion of the sides of the diode chiplet 300A, 300B. In one embodiment, the portion of the sides of the diode chiplet 300A, 300B on which the dielectric material 106 is deposited include the sides of the p+ GaN layer 104 and the quantum well region 103. In another embodiment, the portion of the sides of diode chiplets 300A, 300B on which the dielectric material 106 is deposited further includes a part of the n+ GaN layer 102 as illustrated in FIGS. 3A-3B. The dielectric layer 106 may be relatively thin but thick enough to be electrically isolating (e.g., between 20 and 30 nanometers in thickness). In other embodiments, the dielectric layer 106 may be up to 200 nanometers in thickness. In some embodiments, the thickness of the dielectric layer 106 may be different on the side walls (e.g., the portion of the sides of the diode chiplet 300A, 300B including sides of the p+ GaN layer 104 and the quantum well region 103) than on the top side of the first metal layer 105.

A part of the dielectric material 106 may then be removed from central portion of the diode chiplet 300A, 300B to expose the first metal layer 105. The material of the first terminal 105A is then deposited on the exposed first metal layer 105. The material of the first terminal 105A may be the same material as the first metal layer 105 such that the first terminal 105A is metal bump for printing purposes and forms a contact to the p-reflector metal. As shown in FIGS. 3A-3B, the first terminal 105A may be centrally located above the top side of the diode chiplet 300A, 300B.

The second metal layer 107 including a plurality of second terminals 107A, 107B may then be deposited on the dielectric layer 106 and to an exposed portion of the sides of the n+ GaN layer 102. The second metal layer 107 may be annealed after deposition. Accordingly, the second terminals 107A, 107B are in ohmic contact with the n+ GaN layer 102 such that the second terminals 107A, 107B are n-contacts. In the embodiments in FIGS. 3A-3B, the second terminals 107A, 107B are also deposited on a portion of the top side of the dielectric material 106. Accordingly, the diode chiplets 300A, 300B include lateral n-contacts that provide a top connection. In the embodiment in FIG. 3A, the p+ GaN layer 105, the n+ GaN layer 102, and the quantum well region 103 are equal in lateral size. However, the side facets may be tilted as in the embodiment in FIG. 3B for improved processing and light extraction. As illustrated in FIG. 3B, the p+ GaN layer 104 is smaller in lateral size than the n+ GaN layer 102. While FIGS. 3A-3B illustrate the second terminals 107A, 107B as covering the entire side facet of the diode chiplets 300A, 300B, in another embodiment, the second terminals 107A, 107B only partially cover the side facets.

Figure 5:
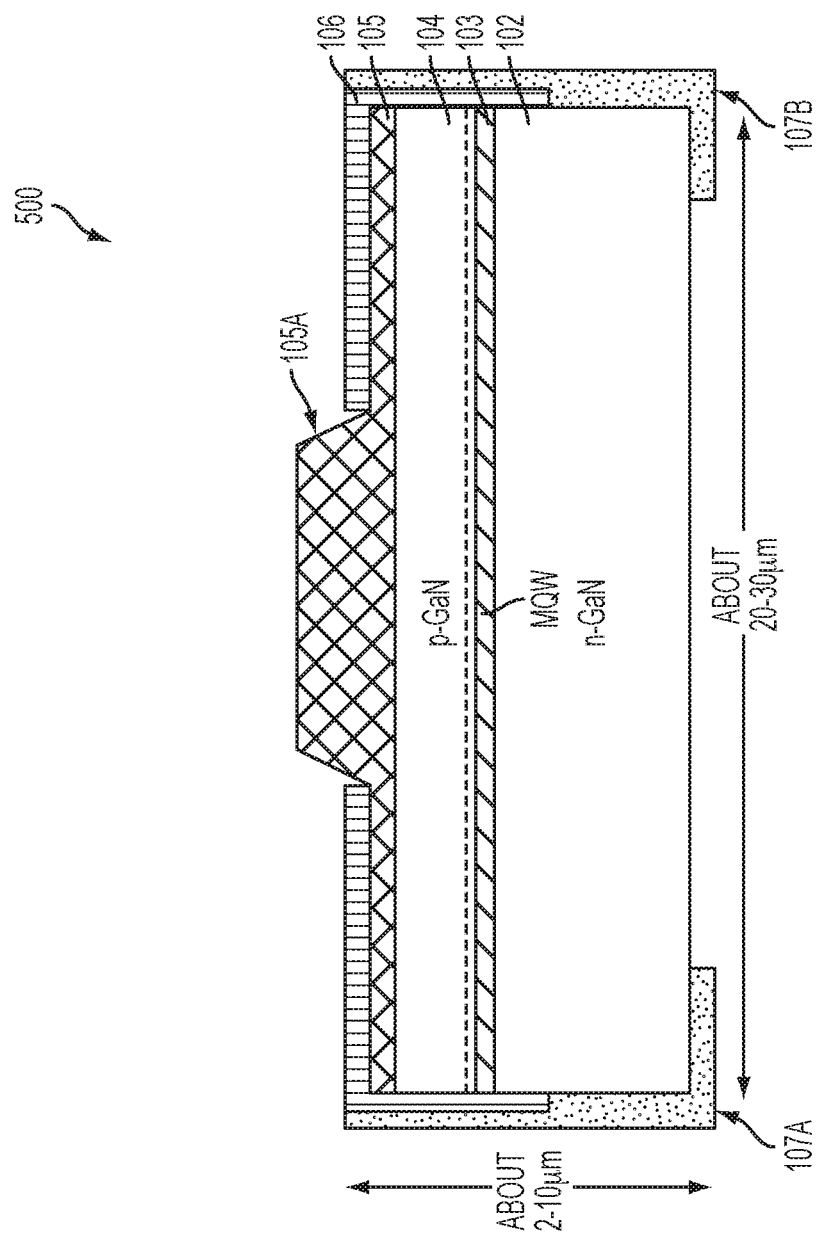
FIG. 5 illustrates a cross-sectional view illustrating an exemplary diode chiplet in accordance with a fourth embodiment of the invention.

FIG. 5 illustrates a cross-sectional view illustrating an exemplary diode chiplet 500 in accordance with a fourth embodiment of the invention. The diode chiplet 500 as illustrated in FIG. 5 is similar to the diode chiplet 300A in FIG. 3A, rather than being coupled to the top side of the dielectric material 106, the second terminals 107A, 107B are coupled to the bottom side of the n+ GaN layer 102.

To fabricate the diode 500 in FIG. 5, similar to the diode chiplet 300A, the dielectric layer 106 is deposited on the top side of the first metal layer 105 and a portion of the sides of the diode chiplet 500. In one embodiment, the portion of the sides of the diode chiplet 500 on which the dielectric material 106 is deposited include the sides of the p+ GaN layer 104 and the quantum well region 103. In another embodiment, the portion of the sides of the diode chiplet 500 on which the dielectric material 106 is deposited further includes a part of the n+ GaN layer 102 as illustrated in FIG. 5. The dielectric layer 106 may be between 20 and 30 nanometers in thickness. In other embodiments, the dielectric layer 106 may be up to 200 nanometers in thickness. In some embodiments, the thickness of the dielectric layer 106 may be different on the side walls (e.g., the portion of the sides of the diode chiplet 500) than on the top side of the first metal layer 105.

Similar to the diode chiplet 300A, a part of the dielectric material 106 may then be removed from central portion of the diode chiplet 500 to expose the first metal layer 105. The material of the first terminal 105A is then deposited on the exposed first metal layer 105. The material of the first terminal 105A may be the same material as the first metal layer 105 such that the first terminal 105A is metal bump for printing purposes and forms a contact to the p-reflector metal. As shown in FIG. 5, the first terminal 105A may be centrally located above the top side of the diode chiplet 500.

At this stage, the diode chiplet 500 may be placed on a carrier wafer and the substrate (not shown) may be removed in order for the second terminals 107A, 107B to be deposited. The substrate may then be removed by laser lift-off or other means of substrate removal technique. As shown in FIG. 5, the second terminals 107A, 107B are coupled to the side of the dielectric layer 106, the exposed portion of the sides of the diode chiplet 500 (e.g., the n+ GaN layer 102) and a portion of the bottom side of the n+ GaN layer 102. Thus, the second metal layer 107 and the second terminals 107A, 107B are in ohmic contact with the n+ GaN layer 102. Accordingly, the diode chiplet 500 includes lateral n-contacts that provide for a bottom connection. While the embodiment in FIG. 5 illustrates the p+ GaN layer 105, the n+ GaN layer 102, and the quantum well region 103 being equal in lateral size, it is contemplated that the side facets may be tilted for improved processing and light extraction. Moreover, while FIG. 5 illustrates the second terminals 107A, 107B as covering the enter side facet of the diode chiplet 500, in another embodiment, the second terminals 107A, 107B only partially cover the side facets.

In one embodiment, the diode chiplet 500 does not include a dielectric layer 106. Instead, in this embodiment, the second terminals 107A, 107B are coupled to the exposed portion of the sides of the diode chiplet 500 (e.g., the n+ GaN layer 102) and/or a portion of the bottom side of the n+ GaN layer 102. Thus, the second metal layer 107 and the second terminals 107A, 107B are in ohmic contact with the n+ GaN layer 102. In contrast to the embodiment in FIG. 5, in this embodiment, there is no overlap of the second terminals 107A, 107B with the active zone 103, EBL or p+ GaN layer 104 such that the dielectric layer 106 is not needed.

In the embodiments illustrated in FIGS. 3A-3B and 5, the second metal layer 107 (e.g., n-metal) is designed to not significantly interfere with the light extraction properties, but still allow a homogeneous carrier injection. Specifically, the design of the diode chiplets 300A, 300B, 500 make use of the 3D footprint of the device architecture and position the n-metals on the side faces of the diode chiplets 300A, 300B, 500 such that the interference with the light extraction properties is minimized. Moreover, given the smaller size of the diode chiplets, the current travelling through the diode chiplets may reach the second terminals 107A, 107B located on the sides of the diode chiplets.

As shown in FIGS. 3A-3B and 5, in some embodiments, the diode chiplets 300A, 300B, and 500 have a lateral size between about 20 and 30 microns and the diode chiplets 300A, 300B and 500 excluding the first terminal 105A has a thickness between 2.5 to 10 microns. In one embodiment, the first terminal 105A may be about ⅓ of the thickness of remaining portions of the diode chiplets 300A, 300B, and 500. In one embodiment, the lateral size of the diode chiplets 300A, 300B and 500 may be as small as 100 nanometers and as large as 200 micrometers. In one embodiment, the perimeter of the diode chiplet 300A, 300B, and 500 is smaller than 600 micrometers.

Figure 6A:
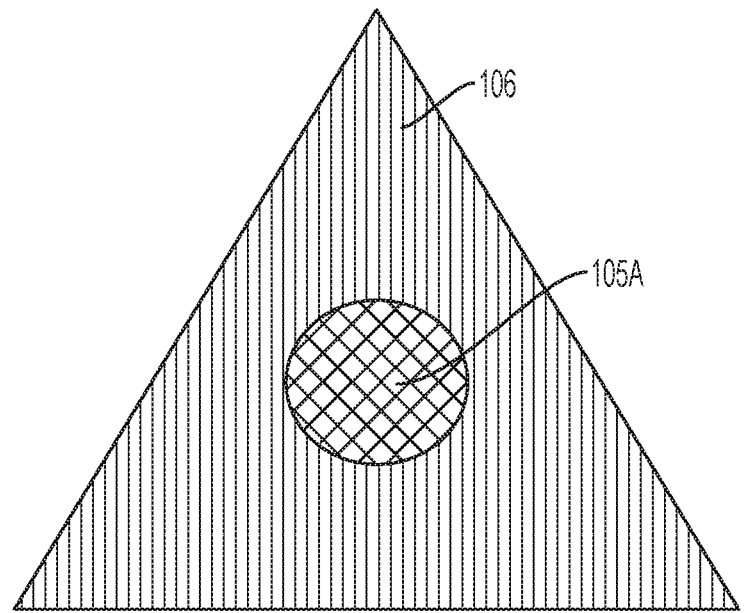
FIGS. 6A-6C illustrate top views of the exemplary diode chiplet in FIG. 5 according to embodiments of the invention.
Figure 6B:
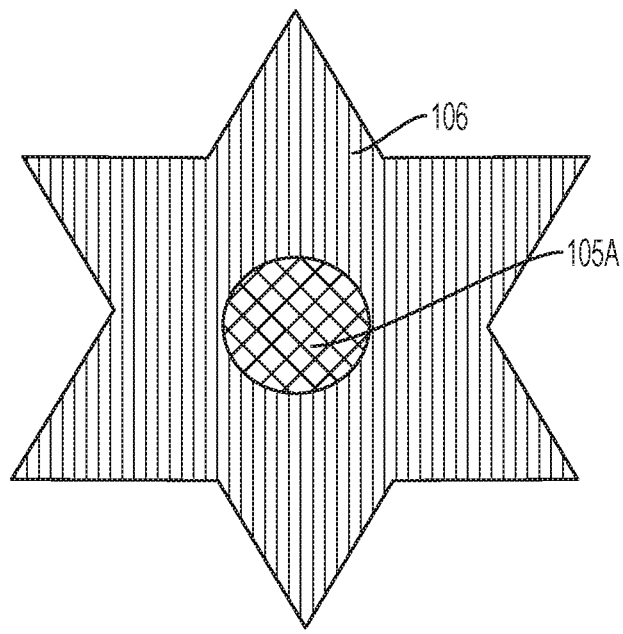
Figure 6C:
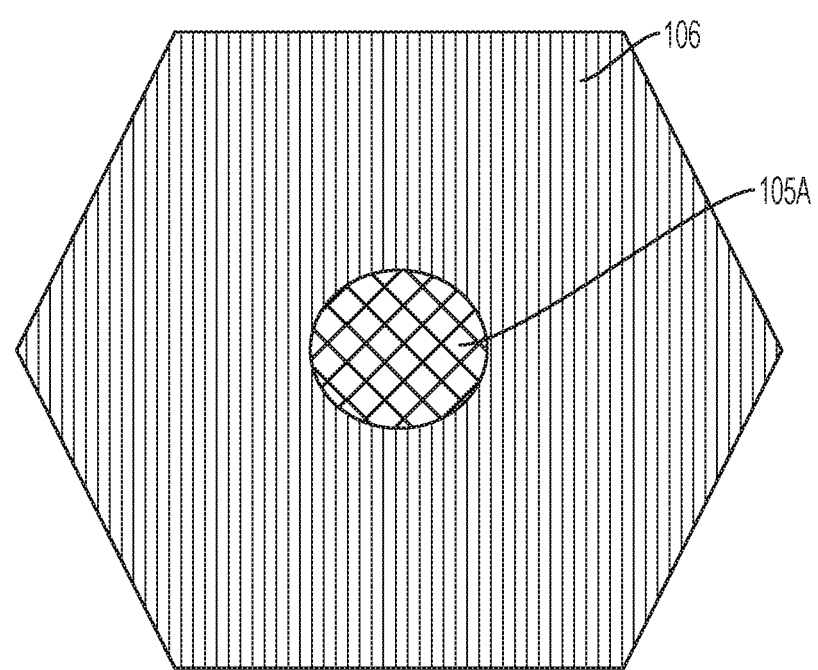

FIGS. 4A-4C illustrate top views of the exemplary diode chiplets 300A, 300B in FIG. 3A-3B according to embodiments of the invention. FIGS. 6A-6C illustrate top views of the exemplary diode chiplet in FIG. 5 according to embodiments of the invention. FIGS. 4A and 6A illustrate the n+ GaN layer 102, quantum well region 103, p+ GaN layer 104, an electron blocking layer, the first metal layer 105 and the dielectric layer 106 of diode chiplets 300A, 300B, 500 being substantially triangular in shape in the x-y plane. FIGS. 4B and 6B illustrate the n+ GaN layer 102, quantum well region 103, p+ GaN layer 104, an electron blocking layer, the first metal layer 105, and the dielectric layer 106 of diode chiplet 300A, 300B, 500 being substantially stellate in shape (or star-shape) in the x-y plane. FIGS. 4C and 6C illustrate the n+ GaN layer 102, quantum well region 103, p+ GaN layer 104, an electron blocking layer, the first metal layer 105 and the dielectric layer 106 of diode chiplets 300A, 300B, 500 being substantially hexagonal in shape in the x-y plane. In other embodiments, the n+ GaN layer 102, quantum well region 103, p+ GaN layer 104, an electron blocking layer, the first metal layer 105, and the dielectric layer 106 of diode chiplets 300A, 300B, 500 may also be substantially circular in shape in the x-y plane or substantially quadratic in shape in the x-y plane. While the top views of the embodiments illustrated in FIGS. 4A-4C and 6A-6C are, respectively, straight-edged triangular, stellate, and hexagonal diode chiplets 300A, 300B, 500, it is understood that the edges of the n+ GaN layer 102, quantum well region 103, p+ GaN layer 104, an electron blocking layer, the first metal layer 105 and the dielectric layer 106 of diode chiplets 300A, 300B, 500 may be rounded.

Figure 7:
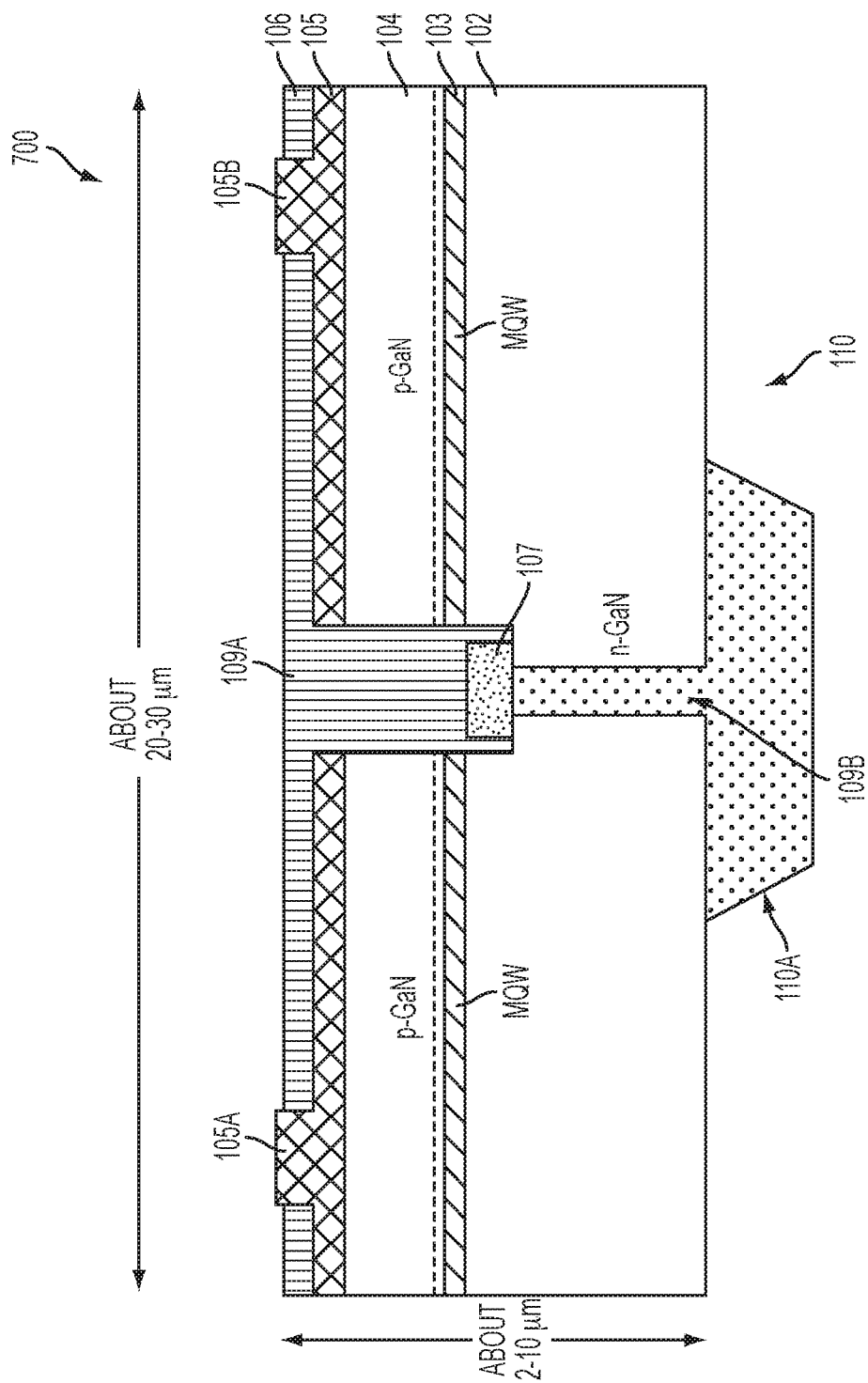
FIG. 7 illustrates a cross-sectional view illustrating an exemplary diode chiplet in accordance with a fifth embodiment of the invention.

FIG. 7 illustrates a cross-sectional view illustrating an exemplary diode chiplet 700 in accordance with a fifth embodiment of the invention. As discussed above, the top view of the diode chiplet 700 may be substantially triangular in shape, substantially stellate in shape, substantially hexagonal in shape, or substantially circular in shape. As shown in FIG. 7, the diode chiplet 700 comprises a n+ GaN layer 102, quantum well region 103, p+ GaN layer 104, and an electron blocking layer (dashed lines). The n+ GaN layer 102, quantum well region 103, p+ GaN layer 104, and electron blocking layer may be deposited on a substrate (not shown). The substrate may be a sapphire substrate that is 4 inches wide and relatively thick (e.g., 500 microns). The diode chiplet 500 further includes the first metal layer 105 that is deposited on a top side of the p+ GaN layer 104. As shown in FIG. 7, the first metal layer 105 may have a lateral size that is substantially equal to the lateral size of the p+ GaN layer 104. The structure including the first metal layer 105 and the n+ GaN layer 102, quantum well region 103, p+ GaN layer 104, an electron blocking layer, and the substrate may be etched to define the size and shape of the diode chiplet 500. In FIG. 7, a portion of the diode chiplet 500 is etched to include a first via 109A. The first via 109A may be etched in a central portion of the diode chiplet 500 and may extend through the first metal layer 105 and through the p+ GaN layer 104, the quantum well region 103, and a part of the n+ GaN layer 102. The first via 109A may be between 500 nanometers to under 10 micrometers in lateral size. In this embodiment, a second metal layer 107 is deposited in the first via 109A as shown in FIG. 7.

A dielectric layer 106 may then be deposited on the first metal layer 105 and into the first via 109A in order to electrically isolate the sides of the first via 109A and the second metal layer 107. As shown in FIG. 7, one or more portions of the dielectric layer 106 may be etched to reach the top of the first metal layer 105. In FIG. 1, the portion being etched away is a rectangular shape. However, it is understood that the portion that is being etched away may be any suitable shape. A metal layer or film may be deposited into one or more portions of the dielectric layer 106 that have been etched away. This metal layer may be the same material as the first metal layer 105 and form the first terminals 105A, 105B that are in ohmic contact with the p+ GaN layer 104. Accordingly, the first terminals 105A, 105B may form the reflective p-contacts for the device 100. As above, the second metal layer 107 is the n-contact metal that is in ohmic contact with the n+ GaN layer 102 and may be a layered stack of metals including a bottom layer of Titanium (Ti) (e.g., 40 nanometers in thickness), followed by a layer of Aluminum (Al) (e.g., 220 nanometers in thickness), followed by another layer of Titanium (Ti) (e.g., 40 nanometers in thickness), and a top layer of Gold (Au) (e.g., 50-100 nanometers in thickness). In some embodiments, Nickel may be used in lieu of the layer of Titanium coupled to the top layer of Gold.

At this stage, the structure including the first terminals 105A, 105B, the first metal layer 105 and the second metal layer 107 may be annealed, transferred to a carrier wafer and the substrate may then be removed by laser lift-off or other means of substrate removal technique. For laser lift-off, a high-power laser may be used to decompose the group III-N film at the substrate-epitaxial layer interface (e.g., the bottom side of n-GaN layer 102) to release the semiconductor film from the substrate. With the substrate removed and the structure flip-chip mounted on a carrier wafer the n-GaN layer 102 is accessible to etch a second via 109B. Referring to FIG. 7, the central part of the bottom side of the n+ GaN layer 102 may be etched to include the second via 109B that connects to the first via 109A. In other embodiments, the first via 109A may be smaller or equal in lateral size than the second via 109B. In the embodiment in FIG. 7, the first via 109A is larger in lateral size than the second via 109B. The second metal layer 107 that is included in the first via 109A is coupled to the intersection between the first via 109A and the second via 109B. The second via 109B may be between 500 nanometers to under 10 micrometers in lateral size.

The diode chiplet 700 further comprises a second terminal 110A that may be coupled to the bottom side of the n+ GaN layer 102 and to the second metal layer 107 through the second via 109B. The second terminal 110A may be a bump for the purposes of printing. In some embodiments, a third metal layer 110 is deposited on the bottom side of the n+ GaN layer 102 and into the second via 109B and includes the second terminal 110A. In one embodiment, the third metal layer 110 is the same as the second metal layer 107 such that it may be a layered stack of metals including a bottom layer of Titanium (Ti) (e.g., 40 nanometers in thickness), followed by a layer of Aluminum (Al) (e.g., 220 nanometers in thickness), followed by another layer of Titanium (Ti) (e.g., 40 nanometers in thickness), and a top layer of Gold (Au) (e.g., 50-100 nanometers in thickness). In some embodiments, Nickel may be used in lieu of the layer of Titanium coupled to the top layer of Gold. In another embodiment, the third metal layer 110 comprises an optical transparent and electrical conductive material such as ITO and Zinc Oxide (ZnO). As shown in FIG. 7, the third metal layer 110 and the second terminal 110A are coupled to the second metal layer 107 and the n+ GaN layer 102 such that the second terminal 110A is in ohmic contact with the n+ GaN layer 102. Accordingly, the diode chiplet 700 may be a vertical LED (VLED) with annealed n-metal.

As shown in FIG. 7, in one embodiment, the diode chiplet 700 has a lateral size between about 20 and 30 microns and the diode chiplet 700 excluding the second terminal 110A has a thickness between 2.5 to 10 microns. In one embodiment, the second terminal 110A may be about ⅓ of the thickness of remaining portions of the diode chiplet 700. In one embodiment, the lateral size of the diode chiplet 700 may be as small as 100 nanometers and as large as 200 micrometers. In one embodiment, the perimeter of the diode chiplet 700 is smaller than 600 micrometers.

In this embodiment, the second metal layer 107 (e.g., n-metal) is designed to not significantly interfere with the light extraction properties, but still allow a homogeneous carrier injection. Specifically, the first via 109A and second via 109B are small and provide access to the n+ GaN layer 102 such that the interference with the light extraction properties is minimized.

In the embodiments, the diode chiplets 100, 300A, 300B, 500, 700 may also include features that allow photons that are wave-guided along the active zone to be redirected towards the bottom for extraction. Such features could be realized by using faceted sidewalls with reflective coatings such as dielectric distributed Bragg reflectors (DBRs). In some embodiments, the faceted sidewalls with reflective coatings may also be tiled for improved processing and better light extraction.

In some embodiments, the diode chiplets 100, 300A, 300B, 500, 700 are designed as thin-film, flip chip LEDs that have an epi thickness of a few microns, and light extraction is performed through the bottom. During manufacture of the thin-film, flip-chip LEDs, the substrate on which the diode is formed is removed. If the substrate used is a sapphire substrate, the removal of the substrate may be performed by laser lift-off. If the substrate used is a silicon (Si) substrate, the removal of the substrate may be performed by wet and/or dry etching. In some embodiments, the diode chiplets 100, 300A, 300B, 500, 700 may include roughening on the backside of the thin epi layer in order to enhance light extraction. Specifically, roughening of the face of the n+ GaN layer may be realized by a Potassium hydroxide (KOH) etchant solution or other texturing of the surface.

The exemplary embodiments of diode chiplets may also be included in "diode ink", namely, a liquid or gel suspension and dispersion of diode chiplets or other two-terminal integrated circuits which is capable of being printed, such as through screen printing or flexographic printing, for example. As described in greater detail above, the diode chiplets according to each embodiment, prior to inclusion in the diode ink composition, are fully formed semiconductor devices which are capable of functioning when energized to emit light (when embodied as LEDs) or provide power when exposed to a light source (when embodied as photovoltaic diodes). Exemplary methods also comprise a method of manufacturing diode ink which disperses and suspends a plurality of diode chiplets in a solvent and viscous resin or polymer mixture which is capable of being printed to manufacture LED-based devices and photovoltaic devices.

While the description is focused on diode chiplets as a type of two-terminal integrated circuit, those having skill in the art will recognize that other types of semiconductor devices may be substituted equivalently to form what is referred to more broadly as a "semiconductor device ink", and that all such variations are considered equivalent and within the scope of the disclosure. Accordingly, any reference herein to "diode" shall be understood to mean and include any two-terminal integrated circuit, of any kind, such as resistors, inductors, capacitors, RFID circuits, sensors, piezo-electric devices, etc., and any other integrated circuit which may be operated using two terminals or electrodes.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

The invention claimed is:

1. A diode chiplet comprising:
    an n-type group III-nitride portion, a p-type group III-nitride layer, and a group III-nitride light emitting region sandwiched between the n- and p-type portion;
    a first metal layer having a bottom side coupled to the p-type III-N layer and a top side including a first terminal, the bottom side of the first metal layer has a lateral size that is substantially equal to the p-type III-N layer, the first terminal being centrally located above the light emitting region;
    an electrically-insulating layer directly coupled to the top side of the first metal layer, sides of the first metal layer and sides of the p-type III-N layer, sides of the light emitting region, and sides of a first part of the n-type III-N layer, wherein the first terminal and sides of a second part of the n-type III-N layer are exposed from the electrically-insulating layer, wherein the sides of the first part of the n-type III-N layer are respectively (i) parallel to the sides of the second part of the n-type III-N layer and (ii) directly connected in line with the sides of the second part of the n-type III-N layer; and
    a second metal layer including a second terminal directly coupled to the electrically-insulating layer and to the sides of the second part of the n-type III-N portion, wherein the second metal layer is directly coupled to a top side of a portion of the electrically-insulating layer that is coupled to the top side of the first metal layer, wherein a perimeter of the diode chiplet is smaller than 600 micrometers and a thickness of the diode chiplet excluding the second terminal is between 2 and 20 micrometers.

2. The diode chiplet of claim 1, wherein the lateral size is between 10 micrometers and 50 micrometers.

3. The diode chiplet of claim 1, wherein the n-type and p-type portion is made out of GaN, and wherein the light emitting region includes at least one layer made of InGaN.

4. The diode chiplet of claim 1, wherein the p-type III-N portion, the n-type III-N portion, and the light emitting region are equal in lateral size.

5. The diode chiplet of claim 1, wherein the p-type III-N portion is smaller in lateral size than the n-type III-N portion.

6. The diode chiplet of claim 1, wherein the second terminal is coupled to a portion of a bottom side of n-type III-N portion, the bottom side of the n-type III-N portion being opposite to the top side of the first metal layer.

7. The diode chiplet of claim 1, wherein, the first metal layer comprises at least one of: (i) Silver (Ag), (ii) Indium Tin Oxide (ITO) and a Distributed Bragg Reflector (DBR), (iii) Nickel Oxide (NiO) and Silver (Ag), (iv) Aluminum, (v) Nickel, (vi) Palladium (Pd), or (vii) Platinum (Pt).

8. The diode chiplet of claim 1, wherein the second metal layer comprises at least one of: (i) Titanium (Ti) and Aluminum, (ii) Aluminum, (iii) Titanium/Gold (Ti/Au), or (iv) a layered stack of metals including: a first layer of Titanium (Ti) on the bottom of the layered stack, a second layer of Aluminum (Al), a third layer of Titanium (Ti) or Nickel (Ni), and a fourth layer of Gold (Au) on the top of the layered stack.

9. The diode chiplet of claim 1, wherein the electrically-insulating material electrically isolates the second metal layer from the first metal layer, the p-type III-N portion and the light emitting region, and wherein the electrically-insulating layer includes at least one of: silicon nitride ($Si_xN_y$), silicon oxide ($Si_xO_y$), silicon oxynitride ($Si_xO_yN_z$), aluminum oxide ($Al_xO_y$), tantalum oxide ($Ta_xO_y$), or hafnium oxide ($Hf_xO_y$).

10. The diode chiplet of claim 1, wherein, laterally, the diode chiplet is substantially triangular in shape, is substantially stellate in shape, is substantially hexagonal in shape, is substantially quadratic in shape, or is substantially circular in shape.

* * * * *